310-334 SR
4/14/87 OR 4,658,176

United States Patent [19]
Nakaya et al.

[11] Patent Number: 4,658,176
[45] Date of Patent: Apr. 14, 1987

[54] ULTRASONIC TRANSDUCER USING PIEZOELECTRIC COMPOSITE

[75] Inventors: Chitose Nakaya, Nishitama; Hiroshi Takeuchi, Matsudo; Kageyoshi Katakura, Meguro, all of Japan

[73] Assignees: Hitachi, Ltd.; Hitachi Medical Corporation, both of Tokyo, Japan

[21] Appl. No.: 758,029

[22] Filed: Jul. 23, 1985

[30] Foreign Application Priority Data

Jul. 25, 1984 [JP] Japan ................ 59-152930
Aug. 24, 1984 [JP] Japan ................ 59-174979
Nov. 2, 1984 [JP] Japan ................ 59-230223

[51] Int. Cl.[4] ................ H01L 41/08
[52] U.S. Cl. ................ 310/334; 310/357; 310/358
[58] Field of Search ................ 310/358, 359, 800, 357, 310/334, 338

[56] References Cited

U.S. PATENT DOCUMENTS 4,412,148 10/1983 Klicker et al. ................ 310/358
4,518,889 5/1985 'T Hoen ................ 310/334 X

*Primary Examiner*—Peter S. Wong
*Assistant Examiner*—Emanuel Todd Voeltz
*Attorney, Agent, or Firm*—Antonelli, Terry & Wands

[57] ABSTRACT

An ultrasonic transducer using a piezoelectric composite in which a plurality of piezoelectric poles are arranged in matrix maintaining a gap and a polymer is charged into the gap. The piezoelectric poles are arranged maintaining a pitch which is shorter than a wavelength of a sound wave at a fundamental resonance frequency of the transducer in a medium. Further the pitch may be changed in a direction in which the piezoelectric poles are arranged, in order to restrain the grating lobe from generating.

7 Claims, 11 Drawing Figures

ULTRASONIC TRANSDUCER USING PIEZOELECTRIC COMPOSITE

BACKGROUND OF THE INVENTION

The present invention relates to an ultrasonic transducer employed for ultrasonic diagnosis systems.

Ceramics of the type of zirconium lead titanate (PZT) have heretofore been much used as materials for piezoelectric vibrators in ultrasonic transducers. However, these piezoelectric ceramics (i) have acoustic impedances that are much greater than that of a human body, and require contrivance in regard to acoustic matching layer when they are to be used for diagnosing purposes, (ii) have exremely large dielectric constants and, hence, small piezoelectric voltage constants g, making it difficult to obtain a high voltage when ultrasonic waves are received, and (iii) are not adapted to be curved so as to fit to the shape of a human body. In order to solve these problems, there has been proposed a so-called piezoelectric composite consisting of a combination of a polymer and a piezoelectric material. As an example, there has been reported by Newnham et al. of U.S.A. that a composite material consisting of a polymer in which is buried a PZT pole is effective (Materials Research Bulletin, Vol. 13, pp. 525-536, 1978). There has, in practice, been obtained a composite material which consists of PZT and a polymer such as silicone rubber, epoxy resin, or the like, and which exhibits a small acoustic impedance and a large piezoelectric voltage constant g.

When the ultrasonic waves are to be transmitted and detected using such a piezoelectric composite, it is desired that the polymer and portions of the piezoelectric poles undergo uniform displacement. Generally, however, the polymer is considerably softer than the piezoelectric poles. In practice, it has been clarified that the piezoelectric poles undergo displacement more greatly than the polymer portion. When the ultrasonic waves are to be transmitted, therefore, there develops acoustic noise, i.e., a so-called grating lobe. The grating lobe consists of undesirable ultrasonic waves other than main ultrasonic waves, the grating lobe being emitted in the directions determined by a pitch of piezoelectric pole arrangement to deteriorate the ultrasonic image.

SUMMARY OF THE INVENTION

The object of the present invention is to provide an ultrasonic transducer using a piezoelectric composite which has excellent performance developing a small grating lobe.

A feature of the invention resides in that the sum of the width of piezoelectric poles constituting the piezoelectric composite and of the width of polymer portions filling the gaps, is set to be smaller than one wavelength, in order to reduce the grating lobe.

Study has heretofore been conducted extensively concerning the grating lobe of an electron scanning-type transducer in which are arrayed a plurality of transducer elements, and it has been found that the gap among the elements should be shorter than one wavelength.

The inventors have discovered the fact that even in a transducer employing a piezoelectric composite, the grating lobe stems from the cutting like the case of the electron scanning-type transducer. The inventors therefore have furthered the study and have found that the grating lobe can be restrained even with the piezoelectric composite if the gap among the elements is set to be shorter than one wavelength.

Another feature of the present invention resides in that at least one of the width of the piezoelectric poles and the gap among the piezoelectric poles is changed in a direction in which the piezoelectric poles are arranged.

DETAILED DESCRIPTION OF THE INVENTION

Figure 1:
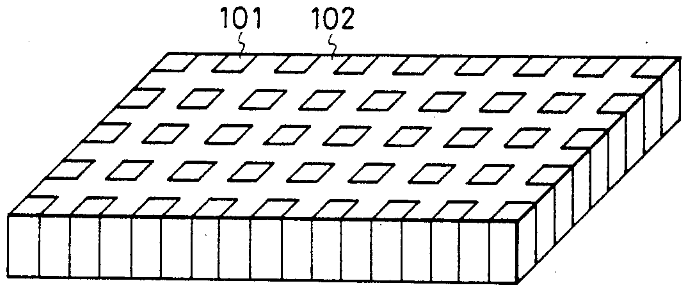
FIG. 1 is a perspective view showing a piezoelectric composite employed in an embodiment of the present invention.

FIG. 1 shows construction of a piezoelectric composite with which the present invention is concerned. Piezoelectric poles 101 polarized in the lengthwise direction are arranged in the form of a matrix, and the space among them is filled with a polymer 102. The piezoelectric poles 101 may be composed of a PZT [$Pb(TiZr)O_3$] ceramic or a lead titanate ($PbTiO_3$) ceramic. The polymer 102 may be a silicone rubber, a polyurethane, or an epoxy resin.

Figure 2A:
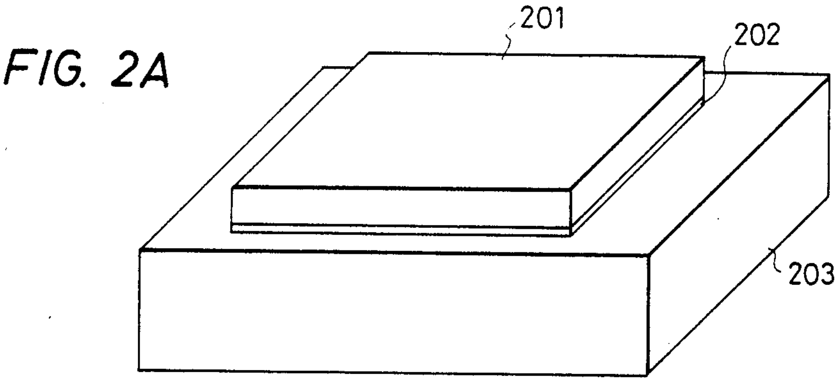
FIGS. 2A, 2B and 2C are perspective views showing the steps for producing the piezoelectric composite of FIG. 1.
Figure 2B:
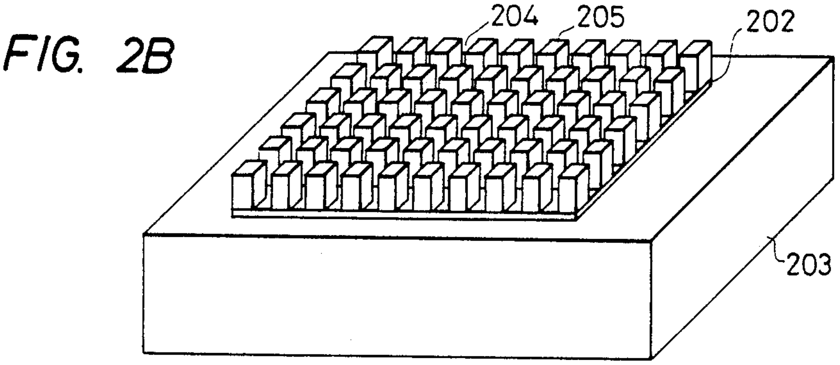
Figure 2C:
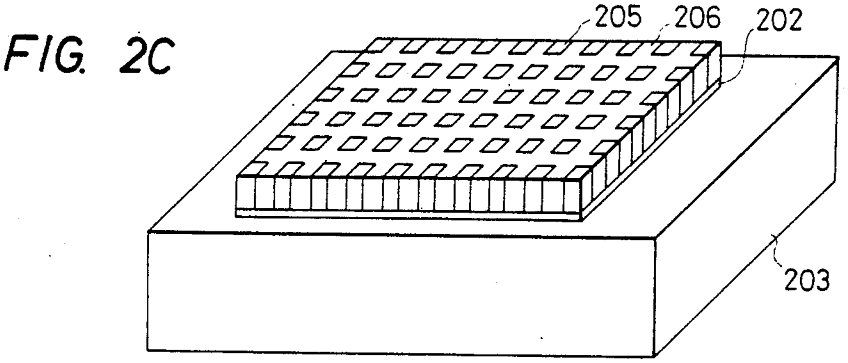

A method of producing the piezoelectric composite is shown in FIGS. 2A to 2C. A plate-like piezoelectric member 201 shown in FIG. 2A is temporarily adhered to a bedplate 203 with an adhesive (wax) 202 that softens upon heating. The piezoelectric member is then cut into the form of a matrix as shown in FIG. 2B to form piezoelectric poles 205 with many cutting grooves 204. Then, a polymer 206 is charged and cured in the cutting grooves as shown in FIG. 2C, and is peeled off from the bedplate, thereby to obtain a composite that is shown in FIG. 1.

Figure 3:
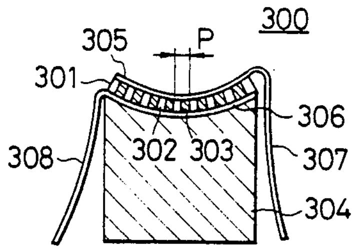
FIG. 3 is a sectional view of the embodiment of the present invention.

FIG. 3 is a sectional view of an ultrasonic transducer 300 according to an embodiment of the present invention.

A piezoelectric composite plate 301 obtained by circularly cutting the piezoelectric composite of FIG. 1, is shaped in a concave manner, and electrodes 305, 306 composed of a Cr-Au layer or a like layer are formed on the upper and lower surfaces thereof. A backing member composed of an epoxy resin is formed on the convex side. Lead wires 307, 308 are connected to the electrodes 305, 306, respectively. Transducers of the above-mentioned construction are prepared but having different sums of the pitch P of piezoelectric pole 302, i.e., width of the piezoelectric pole 302 and the width of polymer portion 303 on the surface where the electrode 305 is formed. Directivities of the transducers are measured.

Figure 4:
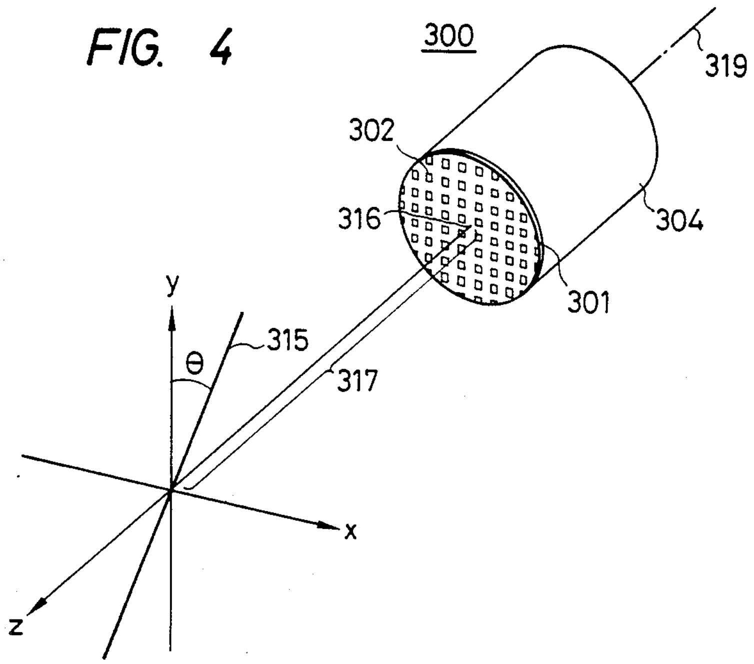
FIG. 4 is a perspective view illustrating a method of measuring the directivity according to the embodiment.

FIG. 4 shows a measuring method. The transducer 300 is immersed in water and is so secured that its center axis 319 is in agreement with the Z-axis. Measurement is taken by placing a tiny reflector on an X-Y plane that is perpendicular to the Z-axis. The plane of observation is distant from a central point 316 on the surface of the transducer 300 by a distance 317 that is equal to a focal distance of the transducer. The X-axis and Y-axis are in agreement with the directions in which the piezoelectric poles 302 are arranged in the piezoelectric composite of the transducer 300. If the reflector is moved along a line 315 which is tilted by an angle $\theta$ relative to the Y-axis to observe the change in the echo amplitude, the directivity can be measured and the grating lobe can be observed in addition to the main beam. The level of the grating lobe becomes a maximum when the line 315 comes into agreement with the X-axis or the Y-axis. Therefore, if the distribution is measured along the X-axis or the Y-axis, the level of the grating lobe can be easily evaluated.

Figure 5:
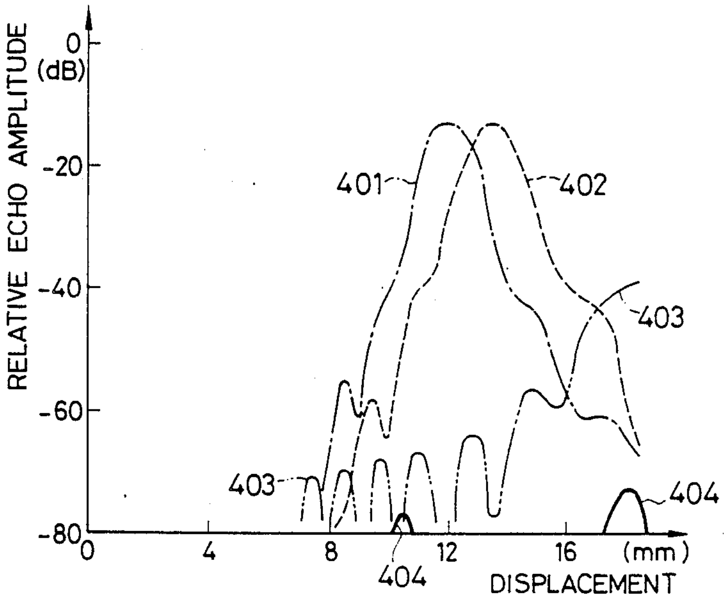
FIG. 5 is a diagram of characteristics showing directivities according to the embodiment.

FIG. 5 shows the results of the measurement same as the above-mentioned measurement but performed by computer simulation, wherein the ordinate represents the relative echo amplitude and the abscissa represents the displacement of the reflector. Curves 401, 402, 403 and 404 represent the cases where the pitch P for arranging the piezoelectric poles (i.e., the sum of the width of piezoelectric poles 303 and the width of polymer portion 304) is 1.6 wavelengths, 1.5 wavelengths, 1.2 wavelengths, and 1 wavelength. In this case, the wavelength is that of a sonic wave of a fundamental resonance frequency of the transducer in a wave propagating medium (water in this embodiment). The fundamental resonance frequency is generally determined by the thickness of the piezoelectric vibrator. When the pitch P for arranging the piezoelectric poles is greater than 1.2 wavelengths, there develop grating lobes of high sound-pressure levels as represented by curves 401, 402 and 403 in FIG. 5. When the pitch P is equal to one wavelength, however, the sound-pressure level of the grating lobe is smaller than −70 dB relative to the main beam. When the pitch P is shorter than one wavelength, the grating lobe is too small to appear on the graph of FIG. 5.

From the above results, it can be understood that the transducer in which the piezoelectric poles are arranged in the piezoelectric composite maintaining a pitch of smaller than one wavelength, exhibits a small grating lobe and excellent directivity. This also holds true for a transducer such as plane transducer having a transmitting/receiving plane different from that of the above-mentioned embodiment.

Figure 6:
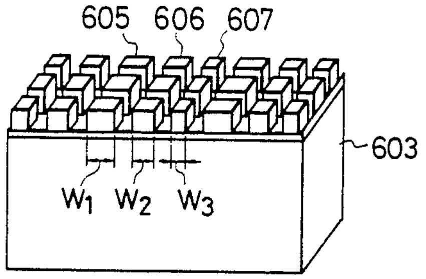
FIGS. 6 and 7 are perspective views showing further embodiments according to the present invention.

FIG. 6 shows a step for producing a piezoelectric composite used for another embodiment which restrains the grating lobe from generating. In this embodiment, the distance among the cutting grooves is not maintained constant but is varied at the time of cutting a piezoelectric plate on a cutting bedplate 603. Therefore, piezoelectric poles 605, 606, 607 have different widths as denoted by $W_1$, $W_2$, $W_3$ in FIG. 6. A polymer is charged into the grooves formed by the cutting, and is removed from the bedplate 603 to obtain a piezoelectric composite, in order to produce a transducer like the one shown in FIG. 3. Measurement of the directivity revealed that the sound-pressure level of grating lobe could be considerably reduced compared with that of the piezoelectric composite in which were arranged piezoelectric poles having an equal width. For instance, with the transducer employing a piezoelectric composite composed of PZT ceramic having a piezoelectric pole height of 0.4 mm, width of 0.1 to 0.3 mm and an average width of 0.2 mm, the polymer portion having a width of 0.2 mm among the piezoelectric poles, the acoustic noise level inclusive of the level of grating lobe could be reduced to smaller than −50 dB in terms of total sensitivity of transmitting and receiving with respect to the central main beam. The sensitivity for the main beam was nearly the same when compared with the transducer employing a piezoelectric composite in which were arranged piezoelectric poles of the same shape having a width of 0.2 mm.

Figure 7:
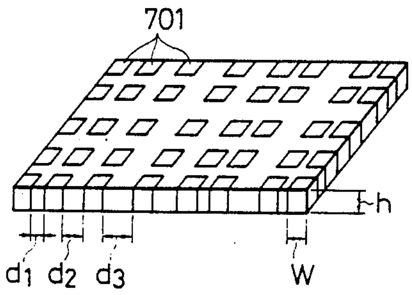

FIG. 7 shows a further embodiment according to the present invention. In the embodiment of FIG. 6, the width W of the piezoelectric poles was successively changed in a direction in which they are arranged. In the embodiment of FIG. 7, however, use is made of piezoelectric poles 701 composed of the PZT ceramic having the same width W, and the distance among the piezoelectric poles is successively changed in the direction in which they are arranged as denoted by $d_1$, $d_2$, $d_3$. The transucer employing such a piezoelectric composite also exhibits a small grating lobe level and excellent directivity.

Figure 8:
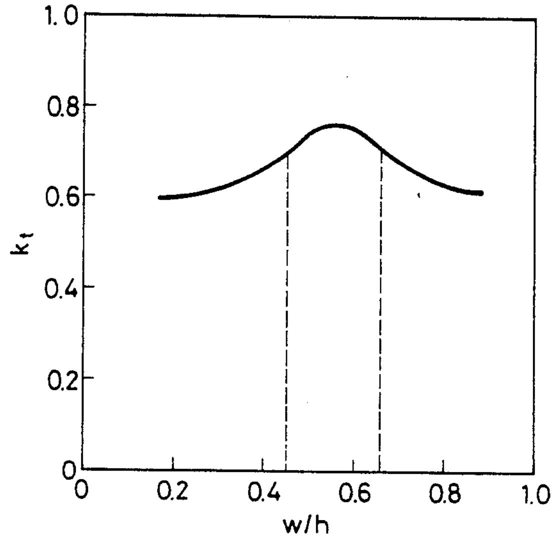
FIGS. 8 and 9 are diagrams showing characteristics of the embodiment of FIG. 7.

FIG. 8 shows the change of thickness dilatational electro-mechanical coupling factor of the piezoelectric composite of FIG. 7 when the ratio W/h of the width W to the height h of piezoelectric poles is changed. The volume ratio $V_{PZT}$ of piezoelectric poles maintained at 0.25 for the whole piezoelectric composite. When the ratio W/h ranges from 0.45 to 0.65, the thickness dilatational electro-mechanical coupling factor Kt becomes particularly large, i.e., larger than 0.7, exceeding that of the conventional piezoelectric composite materials.

Figure 9:
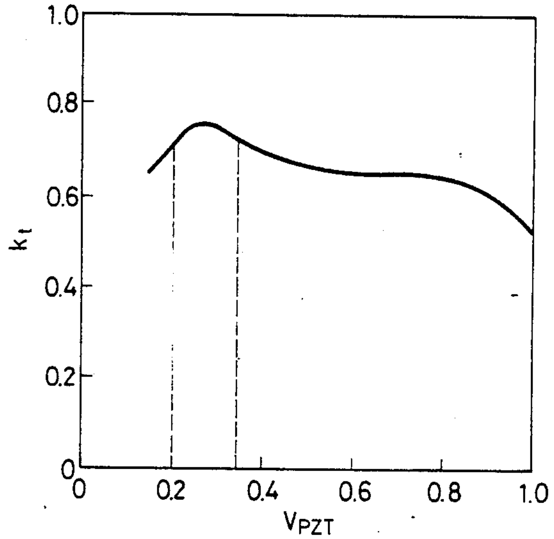

FIG. 9 shows the change of electro-mechanical coupling factor Kt when the volume ratio $V_{PZT}$ of piezoelectric poles is changed while maintaining the ratio W/h at 0.5. When the volume ratio $V_{PZT}$ ranges from 0.2 to 0.35, the electro-mechanical coupling factor Kt becomes greater than 0.7.

The same results are also obtained from the piezoelectric composite of FIG. 1 in which the piezoelectric poles are arranged maintaining an equal pitch. It will therefore be obvious that a particularly large electro-mechanical coupling factor is obtained when the ratio of width to height of piezoelectric poles ranges from 0.45 to 0.65 and when the volume ratio of piezoelectric poles ranges from 0.2 to 0.35. Namely, the present invention makes it possible to obtain an ultrasonic transducer having high sensitivity.

We claim:

1. An ultrasonic transducer using a piezoelectric composite comprising:

a piezoelectric composite consisting of a plurality of piezoelecric poles arranged maintaining a gap relative to each other, and a polymer charged into the gaps; and electrodes formed on the upper and lower surfaces of said piezoelectric composite;

wherein each pitch defined by the sum of the width of one of said piezoelectric poles and the width of said gap is smaller than a wavelength that is determined by a fundamental resonance frequency of the transducer and the speed of sound in a wave propagating medium.

2. An ultrasonic transducer using a piezoelectric composite according to claim 1, wherein at least one of the width of said piezoelectric poles and the width of said gaps is changed in a direction in which said piezoelectric poles are arranged.

3. An ultrasonic transducer using a piezoelectric composite comprising:

a piezoelectric composite consisting of a plurality of piezoelectric poles arranged maintaining a gap relative to each other, and a polymer charged into the gaps; and electrodes formed on the upper and lower surfaces of said piezoelectric composite;

wherein at least either one of the width of said piezoelectric poles and the width of said gaps is successively changed in a direction in which said piezoelectric poles are arranged so that in the direction in which said piezoelectric poles are arranged one of the widths of each two adjacent piezoelectric poles spaced by a gap and the widths of each two adjacent gaps spaced by a piezoelectric pole are different.

4. An ultrasonic transducer using a piezoelectric composite according to claim 1, wherein the widths of said piezoelectric poles are successively changed in a direction in which said piezoelectric poles are arranged, and the widths of said gaps are equal to one another.

5. An ultrasonic transducer using a piezoelectric composite according to claim 1, wherein the widths of said gaps are successively changed in a direction in which said piezoelectric poles are arranged, and the widths of said piezoelectric poles are equal to one another.

6. An ultrasonic transducer using a piezoelectric composite according to claim 3, wherein the widths of said piezoelectric poles are successively changed in a direction in which said piezoelectric poles are arranged, and the widths of said gaps are equal to one another.

7. An ultrasonic transducer using a piezoelectric composite according to claim 3, wherein the widths of said gaps are successively changed in a direction in which said piezoelectric poles are arranged, and the widths of said piezoelectric poles are equal to one another.

* * * * *